United States Patent
Amano

(10) Patent No.: US 6,872,252 B2
(45) Date of Patent: Mar. 29, 2005

(54) LEAD-BASED PEROVSKITE BUFFER FOR FORMING INDIUM PHOSPHIDE ON SILICON

(75) Inventor: Jun Amano, Hillsborough, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 395 days.

(21) Appl. No.: 10/093,342

(22) Filed: Mar. 6, 2002

(65) Prior Publication Data

US 2003/0168000 A1 Sep. 11, 2003

(51) Int. Cl.$^7$ .......................... C30B 25/18; C30B 23/02; B32B 15/00
(52) U.S. Cl. ...................... 117/84; 428/643; 117/95
(58) Field of Search ..................... 117/84, 89, 93, 117/95, 102

(56) References Cited

U.S. PATENT DOCUMENTS

| | | | |
|---|---|---|---|
| 4,707,216 A | | 11/1987 | Moroc et al. |
| 4,865,659 A | | 9/1989 | Shigeta et al. |
| 4,965,224 A | | 10/1990 | Horikawa et al. |
| 5,394,826 A | | 3/1995 | Ebe et al. |
| 5,981,980 A | | 11/1999 | Miyajima et al. |
| 6,043,536 A | * | 3/2000 | Numata et al. ............. 257/347 |
| 6,392,257 B1 | * | 5/2002 | Ramdani et al. ............ 257/190 |
| 6,470,125 B1 | * | 10/2002 | Nashimoto et al. ......... 385/122 |
| 6,558,517 B2 | * | 5/2003 | Basceri .................. 204/192.22 |
| 6,559,471 B2 | * | 5/2003 | Finder et al. ................. 257/22 |
| 6,563,118 B2 | * | 5/2003 | Ooms et al. ............. 250/338.3 |
| 6,583,034 B2 | * | 6/2003 | Ramdani et al. ............ 438/507 |
| 6,590,236 B1 | * | 7/2003 | El-Zein et al. .............. 257/201 |
| 6,594,414 B2 | * | 7/2003 | Tungare et al. ............... 385/18 |
| 2002/0006733 A1 | | 1/2002 | Noguchi et al. |
| 2002/0025101 A1 | * | 2/2002 | Kaatz .......................... 385/14 |

OTHER PUBLICATIONS

Motorola Labs, "The Discovery: Motorola Labs Solves a 30–Year Semiconductor Industry Puzzle," (2001), no month.

Foster et al., "Single–crystal Pb(ZrxTi1–x)O3 thin films prepared by metal–organic chemical vapor deposition: Systematic compositional variation of electronic and optical properties," J. Appl. Phys. 81 (5), Mar. 1, 1997.

Bai et al., "Preparation and structure of PbZrO3 epitaxial films by metalorganic chemical vapor deposition," Appl. Phys. Lett. 62 (15), Apr. 12, 1993.

* cited by examiner

Primary Examiner—Nadine G. Norton
Assistant Examiner—Matthew Anderson

(57) ABSTRACT

A method of forming a high quality epitaxial indium phosphide layer on a silicon substrate and a semiconductor device formed by the same method are described. In one aspect, a lead-based perovskite buffer is formed on a silicon substrate, and an epitaxial indium phosphide layer is formed on the lead-based perovskite buffer. In accordance with this approach, relatively large (e.g., up to 300 millimeters in diameter) high quality indium phosphide films may be produced with the relatively high mechanical stability provided by silicon substrates. In this way, intrinsic problems associated with prior approaches that involve growth of high quality indium phosphide thin films on indium phosphide substrates, which are characterized by small wafer size, brittleness and high cost, may be avoided.

20 Claims, 2 Drawing Sheets

LEAD-BASED PEROVSKITE BUFFER FOR FORMING INDIUM PHOSPHIDE ON SILICON

BACKGROUND

Devices that require high quality epitaxial indium phosphide thin films traditionally are formed on indium phosphide substrates. These substrates, however, are characterized by small wafer size, brittleness and high cost. Accordingly, there is much interest in developing techniques for growing high quality epitaxial indium phosphide thin films on other material systems, for example, silicon substrates, which offer superior mechanical and cost performance relative to indium phosphide substrates.

A wide variety of different approaches for forming indium phosphide thin films on silicon substrates have been proposed. For example, indium phosphide layers have been formed directly on a silicon substrate. In accordance with these processes, an indium phosphide layer may be formed in one or two steps. In a conventional one-step process, a single thin film of monocrystalline indium phosphide is formed directly on silicon substrates. In a conventional two-step process, an amorphous indium phosphide buffer layer initially is formed on a silicon substrate and a final thin film of monocrystalline indium phosphide is formed on the amorphous indium phosphide buffer layer. The indium phosphide layers formed by these methods, however, are characterized by high defect rates and low quality surface morphology and, in general, are not suitable for large scale semiconductor device fabrication. The relatively large lattice mismatch (on the order of 8%) between indium phosphide and silicon is a major contributor to the low quality of the indium phosphide films formed by these methods.

In an effort to reduce lattice-mismatch induced defects and surface roughness in indium phosphide thin films formed on silicon substrates, U.S. Pat. No. 4,965,224 has proposed forming a gallium arsenide buffer layer on a silicon substrate and an amorphous indium phosphide buffer between a monocrystalline indium phosphide thin film and the gallium arsenide buffer layer. Because gallium arsenide has a lattice constant that is intermediate between the lattice constants of the indium phosphide thin film and the silicon substrate, U.S. Pat. No. 4,965,224 asserts that the distortion in the final monocrystalline indium phosphide thin film is reduced relative to the indium phosphide thin films formed by the methods described in the previous paragraph. The lattice mismatch (on the order of 3.8%) between indium phosphide and gallium arsenide, however, is relatively high. In addition, growth of indium phosphide on amorphous indium phosphide produces a defect rate and a surface morphology that, in general, is not suitable for large scale semiconductor device fabrication.

SUMMARY

The invention features a method of forming a high quality epitaxial indium phosphide layer on a silicon substrate, and a semiconductor device formed by the same method. The invention enables relatively large (e.g., up to 300 millimeters in diameter) high quality indium phosphide films to be produced with the relatively high mechanical stability provided by silicon substrates. In this way, the invention overcomes intrinsic problems associated with prior approaches that involve growth of high quality indium phosphide thin films on indium phosphide substrates, which are characterized by small wafer size, brittleness and high cost. In addition, the invention enables highly integrated products that include both silicon based devices and indium phosphide based devices to be fabricated.

In one aspect of the invention, a lead-based perovskite buffer is formed on a silicon substrate, and an epitaxial indium phosphide layer is formed on the lead-based perovskite buffer.

Embodiments of the invention may include one or more of the following features.

The buffer preferably comprises a lead-based perovskite layer that presents to the indium phosphide layer an epitaxial nucleation plane characterized by a lattice constant ($a_{BUFFER}$) that is substantially matched to a characteristic lattice constant ($a_{InP}$) of the indium phosphide layer in accordance with:

$$\frac{|a_{InP} - a_{BUFFER}|}{a_{BUFFER}} \leq 0.02.$$

In some embodiments, the buffer comprises a layer of $Pb(Zr_xTi_{1-x})O_3$, where $0 \leq x \leq 1$. The Zr fraction, x, preferably falls within a range given by $0.5 < x \leq 1$ and, more preferably, has a value of approximately 1. In some embodiments, the $Pb(Zr_xTi_{1-x})O_3$ layer has a composition that is graded with a decreasing Ti composition along a growth direction extending away from the substrate and toward the indium phosphide film. The indium phosphide layer may have an epitaxial orientation that is characterized by an in-plane rotation with respect to a corresponding epitaxial orientation of the $Pb(Zr_xTi_{1-x})O_3$ layer. For example, the epitaxial orientation of the indium phosphide layer may be rotated 45° with respect to the corresponding epitaxial orientation of the $Pb(Zr_xTi_{1-x})O_3$ layer.

In some embodiments, the buffer comprises a lead-based perovskite layer presenting an epitaxial nucleation plane to the indium phosphide layer, and an electrically, thermally and chemically stable barrier layer disposed between the lead-based perovskite layer and the silicon substrate. The barrier layer preferably comprises a mixed transition metal-oxide. The mixed transition metal-oxide may comprise zirconium titanate or strontium titanate, or both.

In some embodiments, the indium phosphide layer is formed in accordance with an atomic layer epitaxial growth process.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
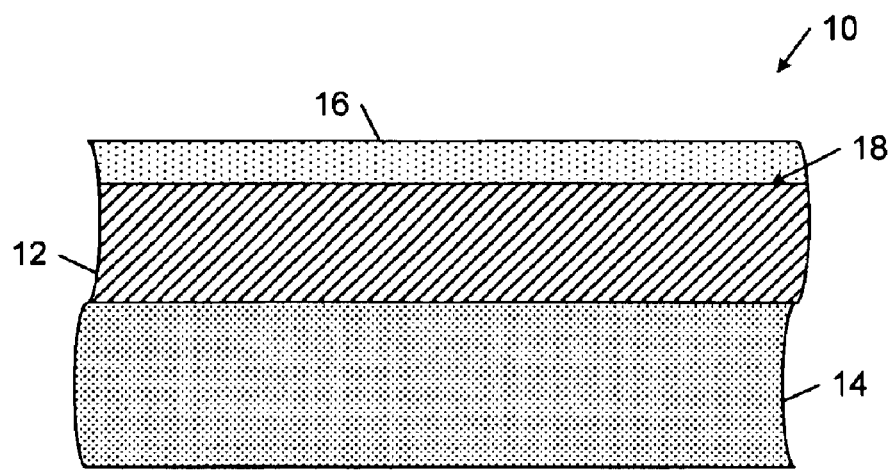
FIG. 1 is a diagrammatic side view of a semiconductor structure that includes an epitaxial indium phosphide layer formed on a buffer, which in turn is formed on a silicon substrate.

Referring to FIG. 1, in one embodiment, a semiconductor structure 10 includes a lead-based perovskite buffer 12 formed on a silicon substrate 14. A high quality epitaxial indium phosphide layer 16 is formed on buffer 12. In general, the lead-based perovskite buffer 12 presents to indium phosphide layer 16 an epitaxial nucleation plane 18 that is characterized by a lattice constant ($a_{BUFFER}$) that is substantially matched to the characteristic lattice constant ($a_{InP}$) of indium phosphide. The lattice mismatch preferably does not exceed 2%, with lattice mismatch ($\Delta$) defined in accordance with equation (1):

$$\Delta = \frac{|a_{InP} - a_{BUFFER}|}{a_{BUFFER}} \leq 0.02 \quad (1)$$

The lattice constant of indium phosphide at 300° K is 0.587 nm. Consequently, in preferred embodiments, the lattice constant ($a_{BUFFER}$) presented by buffer 12 has a value at 300° K that falls within the range expressed in equation (2):

$$0.575 \text{ nm} \leq a_{BUFFER} \leq 0.599 \text{ nm} \quad (2)$$

In general, indium phosphide layer 16 preferably has a quality that is substantially as good as the quality of bulk indium phosphide wafers that currently are available. For example, the etch pit defect density of indium phosphide layer 16 preferably is less than on the order of $5 \times 10^4$ cm$^{-2}$.

In some embodiments, the buffer 12 presents to the indium phosphide layer 16 a crystalline layer of Pb(Zr$_x$Ti$_{1-x}$)O$_3$, with a Zr fraction, x, that in general falls within a range of $0 \leq x \leq 1$. As explained in detail below with reference to FIG. 2, at certain relative epitaxial orientations, the layer of Pb(Zr$_x$Ti$_{1-x}$)O$_3$ presents to the indium phosphide layer a characteristic lattice constant that decreases roughly linearly from a value of 0.588 nm at x=1 (i.e., PbZrO$_3$), to value of 0.575 nm at x≈0.58. As a result, the relative compositional value, x, preferably falls within a range given by $0.5 < x \leq 1$ and, more preferably, has a value of approximately 1. It is noted that the chemical formula for Pb(Zr$_x$Ti$_{1-x}$)O$_3$ used herein consistently includes an oxygen subscript value of 3; in actual embodiments, however, this value may vary over a range of, for example, 2.7 to 3.3.

Figure 2:
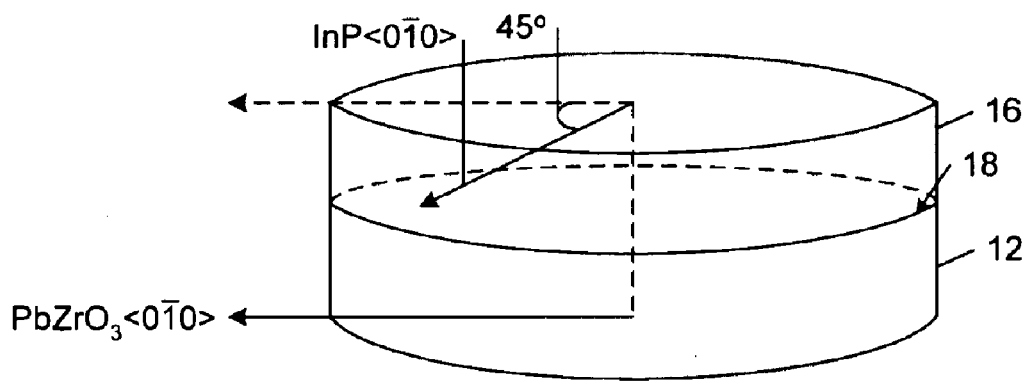
FIG. 2 is a perspective view of a composite crystal structure illustrating schematically a 45° in-plane rotation of the epitaxial orientations of the buffer and indium phosphide layer of FIG. 1.

As shown in FIG. 2, in these embodiments, the indium phosphide layer 16 may have an epitaxial orientation that is characterized by an in-plane rotation with respect to a corresponding epitaxial orientation of the Pb(Zr$_x$Ti$_{1-x}$)O$_3$ layer. For example, in embodiments where the buffer layer 12 presents a PbZrO$_3$ epitaxial nucleation layer to the indium phosphide layer 16, the epitaxial orientation of the indium phosphide layer may be rotated 45° with respect to the corresponding epitaxial orientation of the PbZrO$_3$ layer. That is, the <0$\bar{1}$0> direction of the indium phosphide epitaxial layer 16 is rotated 45° with respect to the <0$\bar{1}$0> direction of the PbZrO$_3$ layer. With this relative epitaxial orientation, the lattice mismatch between the indium phosphide layer and the PbZrO$_3$ layer is on the order of 0.17%, allowing high quality epitaxial indium phosphide layers with thickness up to several microns to be grown. In other embodiments, the degree of relative in-plane epitaxial rotation may be different from 45°, depending upon the particular chemical composition of the lead-based perovskite buffer 12.

In some embodiments, the composition of the Pb(Zr$_x$Ti$_{1-x}$)O$_3$ layer may be graded with a decreasing Ti composition along a growth direction extending away from the substrate and toward the indium phosphide film. This feature may reduce strain-induced defects in buffer 12 that otherwise might result from the lattice mismatch between buffer 12 and the silicon substrate 14.

Figure 3:
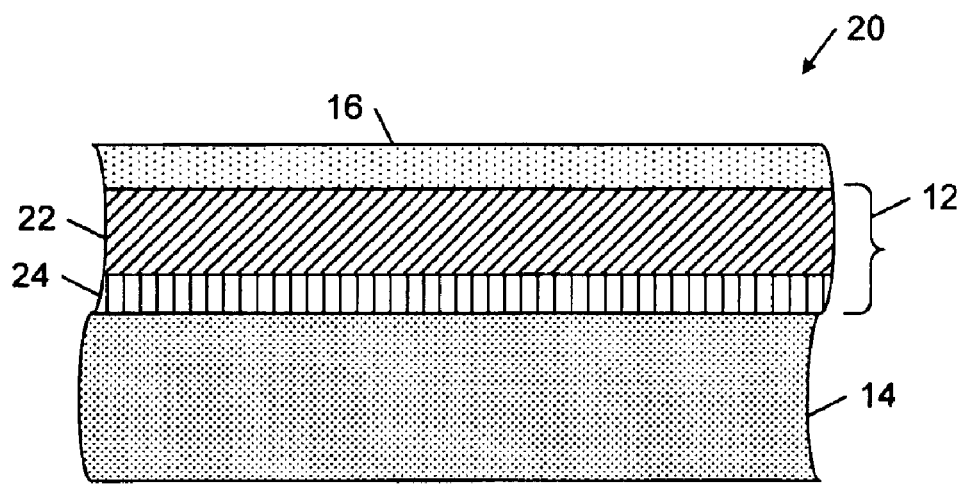
FIG. 3 is a diagrammatic side view of the semiconductor structure of FIG. 1 in which the buffer includes a top lead-based perovskite layer and a bottom barrier layer disposed between the lead-based perovskite layer and the silicon substrate.

Referring to FIG. 3, in one semiconductor structure 20, buffer 12 has multiple layers, including a lead-based perovskite buffer layer 22 and an electrically, thermally and chemically stable barrier layer 24, which is disposed between the buffer layer 22 and the silicon substrate 14. In this embodiment, the barrier layer 24 preferably restricts current flow and oxygen diffusion between the lead-based perovskite buffer layer 22 and the silicon substrate 14 and, thereby, avoids detrimental chemical and electrical interaction between the lead-based perovskite buffer layer 22 and the silicon substrate 14. The barrier layer 24 preferably includes a mixed transition metal-oxide (e.g., zirconium titanate or strontium titanate, or both). Additional details regarding the composition and formation of barrier layer 22 may be obtained from U.S. application Ser. No. 09/420,989, filed Oct. 20, 1999, by Jun Amano and entitled "Barrier Layer for Ferroelectric Memory Devices," which corresponds to published European Patent Application No. EP 1 094 507 A2 and is incorporated herein by reference. In this embodiment, the composition of the lead-based perovskite buffer layer 22 may be graded in order to reduce strain resulting from lattice mismatch between the lead-based perovskite buffer layer 22 and barrier layer 24.

In other embodiments, buffer 12 may include more than two layers, the composition of one or more of which may be graded.

Figure 4:
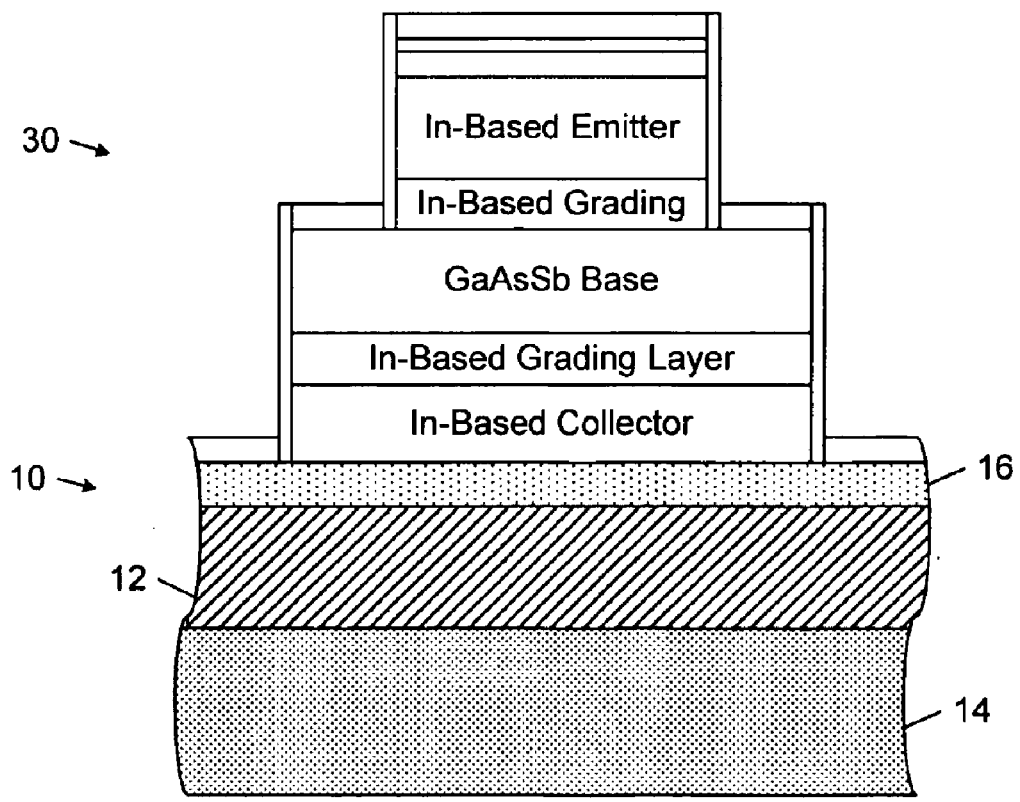
FIG. 4 is a diagrammatic side view of an indium phosphide based semiconductor device formed on the semiconductor structure of FIG. 1.

Referring to FIG. 4, in one embodiment, an indium phosphide based semiconductor device 30 is formed on the semiconductor structure 10 of FIG. 1. In the illustrated embodiment, semiconductor device 30 corresponds to an indium phosphide based double heterojunction bipolar transistor (HBT). In other embodiments, semiconductor device 30 may correspond to any one of a wide variety of conventional devices that may be fabricated on an epitaxial layer of indium phosphide, including electrical, optical and electro-optic devices.

The semiconductor structures described above may be fabricated by conventional semiconductor processing techniques. For example, the lead-based perovskite layers may be formed by metal organic chemical vapor deposition (MOCVD) or reactive sputtering. The indium phosphide layers may be formed by atomic layer deposition techniques, such as molecular beam epitaxy (MBE) or low-temperature MOCVD.

In sum, the above-described embodiments feature a lead-based perovskite buffer that enables a high quality epitaxial indium phosphide layer to be formed on a silicon substrate. In this way, relatively large (e.g., up to 300 millimeters in diameter) high quality indium phosphide films may be produced with the relatively high mechanical stability provided by silicon substrates. The resulting structures may be used as low cost alternatives to indium phosphide wafer substrates. In addition, these structures may be used to form highly integrated semiconductor devices and circuits. For example, standard silicon devices (e.g., CMOS devices) may be fabricated on the silicon substrate, and indium phosphide based circuitry may be fabricated on an indium phosphide layer that is grown epitaxially on a lead-based perovskite buffer that is formed over the silicon device structures.

Other embodiments are within the scope of the claims.

What is claimed is:

1. A method of forming an indium phosphide layer on a silicon substrate, comprising:

forming a lead-based perovskite buffer on the silicon substrate; and forming an epitaxial indium phosphide layer on the lead-based perovskite buffer.

2. The method of claim 1, wherein the buffer comprises a lead-based perovskite layer presenting to the indium phosphide layer an epitaxial nucleation plane characterized by a lattice constant ($a_{BUFFER}$) substantially matched to a characteristic lattice constant ($a_{InP}$) of the indium phosphide layer in accordance with:

$$\frac{|a_{InP} - a_{BUFFER}|}{a_{BUFFER}} \leq 0.02.$$

3. The method of claim 1, wherein the buffer comprises a layer of $Pb(Zr_xTi_{1-x})O_3$, where $0 \leq x \leq 1$.

4. The method of claim 3, wherein $0.5 < x \leq 1$.

5. The method of claim 3, wherein $x \approx 1$.

6. The method of claim 3, wherein the $Pb(Zr_xTi_{1-x})O_3$ layer has a graded composition with a decreasing Ti composition along a growth direction extending away from the substrate and toward the indium phosphide film.

7. The method of claim 3, wherein the indium phosphide layer has an epitaxial orientation characterized by an in-plane rotation with respect to a corresponding epitaxial orientation of the $Pb(Zr_xTi_{1-x})O_3$ layer.

8. The method of claim 7, wherein the epitaxial orientation of the indium phosphide layer is rotated 45° with respect to the corresponding epitaxial orientation of the $Pb(Zr_xTi_{1-x})O_3$ layer.

9. The method of claim 1, wherein the buffer comprises a lead-based perovskite layer presenting an epitaxial nucleation plane to the indium phosphide layer, and an electrically, thermally and chemically stable barrier layer disposed between the lead-based perovskite layer and the silicon substrate.

10. The method of claim 9, wherein the barrier layer comprises a mixed transition metal-oxide.

11. A semiconductor device, comprising:

a silicon substrate;

a lead-based perovskite buffer formed on the silicon substrate; and an epitaxial indium phosphide layer formed on the lead-based perovskite buffer.

12. The semiconductor device of claim 11, wherein the buffer comprises a lead-based perovskite layer presenting to the indium phosphide layer an epitaxial nucleation plane characterized by a lattice constant ($a_{BUFFER}$) substantially matched to a characteristic lattice constant ($a_{InP}$) of the indium phosphide layer in accordance with:

$$\frac{|a_{InP} - a_{BUFFER}|}{a_{BUFFER}} \leq 0.02.$$

13. The semiconductor device of claim 11, wherein the buffer comprises a layer of $Pb(Zr_xTi_{1-x})O_3$, where $0 \leq x \leq 1$.

14. The semiconductor device of claim 13, wherein $0.5 < x \leq 1$.

15. The semiconductor device of claim 13, wherein $x \approx 1$.

16. The semiconductor device of claim 13, wherein the $Pb(Zr_xTi_{1-x})O_3$ layer has a graded composition with a decreasing Ti composition along a growth direction extending away from the substrate and toward the indium phosphide film.

17. The semiconductor device of claim 13, wherein the indium phosphide layer has an epitaxial orientation characterized by an in-plane rotation with respect to a corresponding epitaxial orientation of the $Pb(Zr_xTi_{1-x})O_3$ layer.

18. The semiconductor device of claim 17, wherein the epitaxial orientation of the indium phosphide layer is rotated 45° with respect to the corresponding epitaxial orientation of the $Pb(Zr_xTi_{1-x})O_3$ layer.

19. The semiconductor device of claim 11, wherein the buffer comprises a lead-based perovskite layer presenting an epitaxial nucleation plane to the indium phosphide layer, and an electrically, thermally and chemically stable barrier layer disposed between the lead-based perovskite layer and the silicon substrate.

20. The semiconductor device of claim 19, wherein the barrier layer comprises a mixed transition metal-oxide.

* * * * *